US009979501B2

(12) United States Patent
Abramov et al.

(10) Patent No.: US 9,979,501 B2
(45) Date of Patent: May 22, 2018

(54) FREQUENCY INDEPENDENT ISOLATION OF DUPLEXED PORTS IN DISTRIBUTED ANTENNA SYSTEMS (DASS), AND RELATED DEVICES AND METHODS

(71) Applicant: Corning Optical Communications Wireless Ltd, Airport (IL)

(72) Inventors: Yury Abramov, Petah Tikva (IL); Motti Vahedy, Ashdod (IL)

(73) Assignee: Corning Optical Communications Wireless Ltd, Airport (IL)

( * ) Notice: Subject to any disclaimer, the term of this patent is extended or adjusted under 35 U.S.C. 154(b) by 76 days.

(21) Appl. No.: 15/131,712

(22) Filed: Apr. 18, 2016

(65) Prior Publication Data

US 2016/0233974 A1  Aug. 11, 2016

Related U.S. Application Data

(63) Continuation of application No. PCT/IL2014/050906, filed on Oct. 20, 2014.
(Continued)

(51) Int. Cl.
*H04J 1/12* (2006.01)
*H04B 1/52* (2015.01)
(Continued)

(52) U.S. Cl.
CPC .............. *H04J 1/12* (2013.01); *H03H 7/52* (2013.01); *H04B 1/52* (2013.01); *H04L 5/14* (2013.01);
(Continued)

(58) Field of Classification Search
CPC ..................................... H04J 1/12; H04L 5/14
See application file for complete search history.

(56) References Cited

U.S. PATENT DOCUMENTS 5,815,803 A  9/1998 Ho et al.
6,591,086 B1  7/2003 Pleasant
(Continued)

FOREIGN PATENT DOCUMENTS

WO  2010090999 A1  8/2010

OTHER PUBLICATIONS

Patent Cooperation Treaty, International Search Report for PCT/IL14/050906, dated Jan. 23, 2015, 3 pages.
(Continued)

*Primary Examiner* — Brandon M Renner
(74) *Attorney, Agent, or Firm* — C. Keith Montgomery

(57) ABSTRACT

Frequency independent isolation of duplexed ports in distributed antenna systems (DASs) is disclosed. Instead of providing a duplexer in a DAS that provides frequency dependent separation between downlink and uplink communications signals, an isolation circuit is provided. The isolation circuit is coupled to a duplexed port that provides downlink communications signals to the DAS and receives uplink communications signals from the DAS. To isolate uplink communications signals from the downlink communications path, the isolation circuit includes a directional coupler. The directional coupler provides frequency independent isolation between uplink communications signals and a downlink communications path in the DAS. Further, to isolate downlink communications signals from the uplink communications path, the isolation circuit includes at least one circulator isolator. The circulator(s) acts as a one-direction device, allowing uplink communications signals to flow to the directional coupler with minimal attenuation while significantly attenuating downlink communications signals flowing from the directional coupler.

20 Claims, 6 Drawing Sheets

Related U.S. Application Data

(60) Provisional application No. 61/896,348, filed on Oct. 28, 2013.

(51) Int. Cl.
    *H04W 88/08*     (2009.01)
    *H03H 7/52*     (2006.01)
    *H04L 5/14*     (2006.01)
    *H03H 7/46*     (2006.01)

(52) U.S. Cl.
    CPC ......... *H04L 5/1461* (2013.01); *H04W 88/085* (2013.01); *H03H 7/46* (2013.01)

(56) References Cited

U.S. PATENT DOCUMENTS

| | | | |
|---|---|---|---|
| 2005/0018724 A1* | 1/2005 | Da Silva | H04B 10/572 |
| | | | 372/32 |
| 2008/0227410 A1* | 9/2008 | Cox | H04B 10/505 |
| | | | 455/82 |
| 2013/0177317 A1* | 7/2013 | Rospsha | H04B 10/25754 |
| | | | 398/93 |
| 2013/0272350 A1* | 10/2013 | Huang | H04L 27/01 |
| | | | 375/219 |

OTHER PUBLICATIONS

International Preliminary Report on Patentability for PCT/IL2014/050906, dated May 12, 2016, 10 pages.

Author Unknown, "Specification for LTCC 20dB Directional Coupler," Model Name: RCP890S20N, Feb. 2016, RN2 Technologies co., Ltd., Pyeongtaek-si, Kyunggi-do, Korea, 16 pages.

\* cited by examiner

FREQUENCY INDEPENDENT ISOLATION OF DUPLEXED PORTS IN DISTRIBUTED ANTENNA SYSTEMS (DASS), AND RELATED DEVICES AND METHODS

CROSS-REFERENCE TO RELATED APPLICATIONS

This application is a continuation of International Application No. PCT/IL14/050906 filed on Oct. 20, 2014, which claims the benefit of priority to U.S. Provisional Application No. 61/896,348, filed on Oct. 28, 2013, both applications being incorporated herein by reference in their entireties.

BACKGROUND

The technology of the present disclosure relates generally to distributed antenna systems (DASs) for distributing communications services to remote areas each forming a coverage area and particularly to frequency independent isolation of duplexed ports in DASs.

A cellular communications system can be provided that includes cellular base stations configured to communicate with cellular client devices to provide analog cellular communications services. These cellular base stations are typically co-located with cellular antennas configured to distribute transmitted wireless cellular communications signals from a cellular base station to cellular client devices residing within the wireless range of a cellular antenna. The cellular antennas are also configured to receive transmitted wireless cellular communications signals from cellular client devices to the cellular base station for transmission over a cellular network.

It may be desired to distribute cellular communications services remotely, such as in a building or other facility, to provide clients access to such cellular communications services within the building or facility. One approach to distributing cellular communications services in a building or facility involves use of radio frequency (RF) antenna coverage areas, also referred to as "antenna coverage areas." The antenna coverage areas can have a radius in the range from a few meters up to twenty meters, as an example. Combining a number of access point devices creates an array of antenna coverage areas. Because the antenna coverage areas each cover small areas, there are typically only a few users (clients) per antenna coverage area. This allows for minimizing the amount of RF bandwidth shared among the wireless system users.

As an example, FIG. 1 illustrates distribution of communications services to remote coverage areas 10 of a DAS 12. In this regard, the remote coverage areas 10 are created by and centered on remote antenna units 14 connected to a head-end equipment 16 (e.g., a head-end controller or head-end unit). The head-end equipment 16 may be communicatively coupled to a base station 18. In this regard, the head-end equipment 16 receives downlink communications signals 20D from the cellular base station 18 to be distributed to the remote antenna units 14. The remote antenna units 14 are configured to receive downlink communications signals 20D from the head-end equipment 16 over a communications medium 22 to be distributed to the coverage areas 10 of the remote antenna units 14. Each remote antenna unit 14 may include an RF transmitter/receiver (not shown) and an antenna 24 operably connected to the RF transmitter/receiver to wirelessly distribute the cellular services to client devices 26 within the coverage area 10. The remote antenna units 14 are also configured to receive uplink communications signals 20U from the client devices 26 in the coverage area 10 to be distributed to the cellular base station 18. The size of a given coverage area 10 is determined by the amount of RF power transmitted by the remote antenna unit 14, the receiver sensitivity, antenna gain and the RF environment, as well as by the RF transmitter/receiver sensitivity of the cellular client device 26. Cellular client devices 26 usually have a fixed RF receiver sensitivity, so that the above-mentioned properties of the remote antenna unit 14 mainly determine the size of the remote coverage areas 10.

The equipment in the DAS 12 in FIG. 1 may be provided to support wide radio bands of spectrum commonly used in the cellular industry. For example, a personal communications services (PCS) band may be supported by the DAS 12 that includes the 1850-1910 MegaHertz (MHz) radio band for uplink signals and 1930-1990 MHz band for downlink signals. A cellular radio band may also be supported by the DAS 12 that includes the 824-859 MHz radio band for uplink signals and the 869-894 MHz band for downlink communications signals. In this regard, it may be required to couple a base station to a DAS, such as DAS 12 in FIG. 1, through a duplexed port. A duplexed port allows a DAS to simultaneously receive downlink signals into the DAS and transmit uplink communications signals from the DAS.

In this regard, FIG. 2 illustrates exemplary downlink and uplink path circuits 28D, 28U provided in respective downlink and uplink communications paths 30D, 30U in the DAS 12 of FIG. 1. The downlink and uplink communications paths 30D, 30U extend between the base station 18 and the remote antenna unit 14. The base station 18 is coupled to the DAS via a duplexed port 32. The duplexed port 32 receives downlink communications signals 20D from the base station 18 to be provided to the DAS 12 via the HEE 16 in this example. The duplexed port 32 also receives uplink communications signals 20U from the DAS 12 via the HEE 16 to be provided to the base station 18. A head-end duplexer 34(H) is provided in the HEE 16. The head-end duplexer 34(H) is coupled to the duplexed port 32. The head-end duplexer 34(H) is configured to separate a duplexed downlink and uplink communications path 36 into the separate downlink communications path 30D and a separate uplink communications path 30U. Downlink communications signals 20D are coupled from the head-end duplexer 34(H) to the head-end downlink circuits 28D(H). The downlink communications signals 20D are then distributed from the head-end downlink circuits 28D(H) to the remote downlink circuits 28D(R) in a remote antenna unit 14 to be transmitted through the antenna 24 of the remote antenna unit 14. The uplink communications signals 20U are coupled from the antenna 24 of the remote antenna unit 14 to a remote duplexer 34(R), and from the remote duplexer 34(R) to the remote uplink circuits 28U(R). The uplink communications signals 20U are distributed to the head-end uplink circuits 28U(H), and from the head-end duplexer 34(H) to the base station duplexed port 38.

With continuing reference to FIG. 2, due to expansion of radio bands, the frequency gap between downlink communications signals 20D and the uplink communications signals 20U supported in the DAS 12 may become smaller. For example, the frequency gap between the downlink communications signals 20D and the uplink communications signals 20U may be 10 MHz or less. If frequency gap between the downlink communications signals 20D and the uplink communications signals 20U is too small, it may be difficult or even impossible to provide the required isolation between the downlink and uplink communications paths 30D, 30U in the head-end duplexer 34(H) while maintaining other requirements of the head-end duplexer 34(H), such as low attenuation, lower ripple (i.e., variance in frequency response), small size, and/or low cost. If the isolation provided by head-end duplexer 34(H) is lower than required, a portion of the uplink communications signal 20U can leak through the head-end duplexer 34(H) to the downlink communications path 30D, as shown by leakage path 40 in FIG. 2. This leakage through the downlink communications path 30D might distort the downlink communications signal 20D or even create oscillations on the downlink communications signal 20D.

SUMMARY

Embodiments disclosed herein include frequency independent isolation of duplexed ports in distributed antenna systems (DASs). Related devices and methods of frequency independent isolation of duplexed ports in DASs are also disclosed. Instead of providing a duplexer in a DAS that isolates downlink and uplink communications paths dependent on the frequency separation or gap between downlink and uplink communications signals communicated over the downlink and uplink communications paths, respectively, an isolation circuit is provided. The isolation circuit is coupled to a duplexed port that provides downlink communications signals to the DAS and receives uplink communications signals from the DAS. In order to isolate the uplink communications signals from the downlink communications path, the isolation circuit includes a directional coupler. The directional coupler provides frequency independent isolation between uplink communications signals and a downlink communications path in the DAS.

In this manner, the isolation provided by the isolation circuit between the downlink and uplink communications paths is not dependent on the frequency gap between the downlink and uplink communications signals. Therefore, the DAS employing the isolation circuit may be used to support communications services where the frequency gap between the downlink and uplink communications signals is small (e.g., <=10 MHz) that may otherwise cause distortion in the downlink and/or uplink communications signals if a duplexer were employed.

Further, because the downlink communications signal supplied to the duplexed port may have a significant power level, it may be desired to protect the uplink communications path from the downlink communications signal. To isolate the downlink communications signals from the uplink communications path, the isolation circuit includes at least one circulator isolator. The circulator(s) acts as a one-direction device, allowing uplink communications signals to flow to the directional coupler with minimal or reduced attenuation while significantly attenuating downlink communications signals flowing from the directional coupler.

In one embodiment, an isolation circuit for providing frequency independent isolation of a duplexed port in a DAS comprises a directional coupler. The directional coupler comprises a first coupler port configured to be coupled to a duplexed port of a DAS to receive a downlink communications signal. The duplexed port is configured to provide duplexed downlink communications signals and uplink communications signals. The directional coupler also comprises a second coupler port configured to be coupled to an uplink communications path in the DAS to receive an uplink communications signal in the uplink communications path and receive a first portion of the downlink communications signal received by the first coupler port. The directional coupler also comprises a third coupler port configured to be coupled to a downlink communications path in the DAS to direct a second portion of the downlink communications signal received on the first coupler port from the duplexed port to the downlink communications path. The directional coupler is configured to isolate an uplink communications signal received on the second coupler port from the third coupler port, to isolate the uplink communications signal from the second portion of the downlink communications signal directed to the third coupler port. The isolation circuit also comprises at least one circulator. The at least one circulator comprises a first circulator port configured to be coupled to the uplink communications path in the DAS to receive the uplink communications signal from the uplink communications path. The at least one circulator also comprises a second circulator port coupled to the second coupler port of the directional coupler. The at least one circulator is configured to provide the uplink communications signal received on the first circulator port to be provided to the second circulator port to be provided to the second coupler port of the directional coupler. The at least one circulator is also configured to attenuate the first portion of the downlink communications signal received in the second circulator port.

In another embodiment, a method of frequency independent isolating a duplexed port comprises receiving a downlink communications signal from a duplexed port of a DAS on a first coupler port of a directional coupler. The method also comprises directing a first portion of the received downlink communications signal on the first coupler port to a second coupler port of the directional coupler. The method also comprises directing a second portion of the received downlink communications signal on the first coupler port to a third coupler port of the directional coupler. The method also comprises isolating an uplink communications signal received on a second coupler port of the directional coupler from the third coupler port to isolate the uplink communications signal from the second portion of the downlink communications signal directed to the third coupler port. The method also comprises receiving the uplink communications signal from an uplink communications path in the DAS on a first circulator port in at least one circulator, and directing the received uplink communications signal on the first circulator port to a second circulator port of the at least one circulator, the second circulator port coupled to the second coupler port. The method also comprises attenuating the first portion of the received downlink communications signal on the second circulator port.

In another embodiment, a DAS comprises a head-end unit having a plurality of head-end downlink path circuits each provided in a downlink communications path among a plurality of downlink communications paths. The plurality of head-end downlink path circuits are each configured to receive a downlink communications signal in a downlink communications path from a duplexed port and provide the received downlink communications signal to at least one remote antenna unit among a plurality of remote antenna units. The DAS also comprises a plurality of head-end uplink path circuits each provided in an uplink communications path among a plurality of uplink communications paths. The plurality of head-end uplink path circuits are each configured to receive an uplink communications signal from a remote antenna unit among the plurality of remote antenna units in an uplink communications path and provide the received uplink communications signal to the duplexed port. The DAS also comprises the plurality of remote antenna units. Each of the plurality of remote antenna units comprise at least one antenna. Each of the plurality of remote antenna units also comprise a remote downlink path circuit provided in at least one downlink communications path among the plurality of downlink communications paths. The remote downlink path circuit is configured to receive downlink communications signals in the at least one downlink communications path from at least one head-end downlink circuit among the plurality of head-end downlink circuits and wireless transmit the received downlink communications signals over the at least one antenna to at least one client device. Each of the plurality of remote antenna units also comprise a remote uplink path circuit provided in an uplink communications path. The remote uplink path circuit is configured to wirelessly receive uplink communications signals from the at least one antenna from at least one client device in the uplink communications path and provide the received uplink communications signals over the uplink communications path to a head-end uplink path circuit to be provided to the duplexed port.

The DAS also comprises an isolation circuit configured to receive the downlink communications signal from the duplexed port on a first coupler port of a directional coupler. The isolation circuit is also configured to direct a first portion of the received downlink communications signal on the first coupler port, to a second coupler port of the directional coupler coupled to the plurality of uplink communications paths. The isolation circuit is also configured to direct a second portion of the received downlink communications signal on the first coupler port, to a third coupler port of the directional coupler coupled to the downlink communications path. The isolation circuit is also configured to isolate the uplink communications signal received on a second coupler port of the directional coupler from the third coupler port to isolate the uplink communications signal from the second portion of the downlink communications signal directed to the third coupler port. The isolation circuit is also configured to receive uplink communications signals from each of the plurality of remote antenna units on the plurality of uplink communications paths on a first circulator port in at least one circulator. The isolation circuit is also configured to direct the received uplink communications signals on the first circulator port to a second circulator port of the at least one circulator, the second circulator port coupled to the second coupler port. The isolation circuit is also configured to attenuate the received first portion of the downlink communications signal on the second circulator port.

Additional features and advantages are set forth in the detailed description, and in part, will be readily apparent to those skilled in the art. The foregoing general description and the following detailed description are merely exemplary, and are intended to provide an overview or framework to understand the nature and character of the claims. The drawings provide a further understanding and are incorporated in and constitute a part of this specification. The drawings illustrate one or more embodiment(s), and together with the description serve to explain the principles and operation of the various embodiments.

DETAILED DESCRIPTION

Various embodiments will be further clarified by the following examples.

Figure 1:
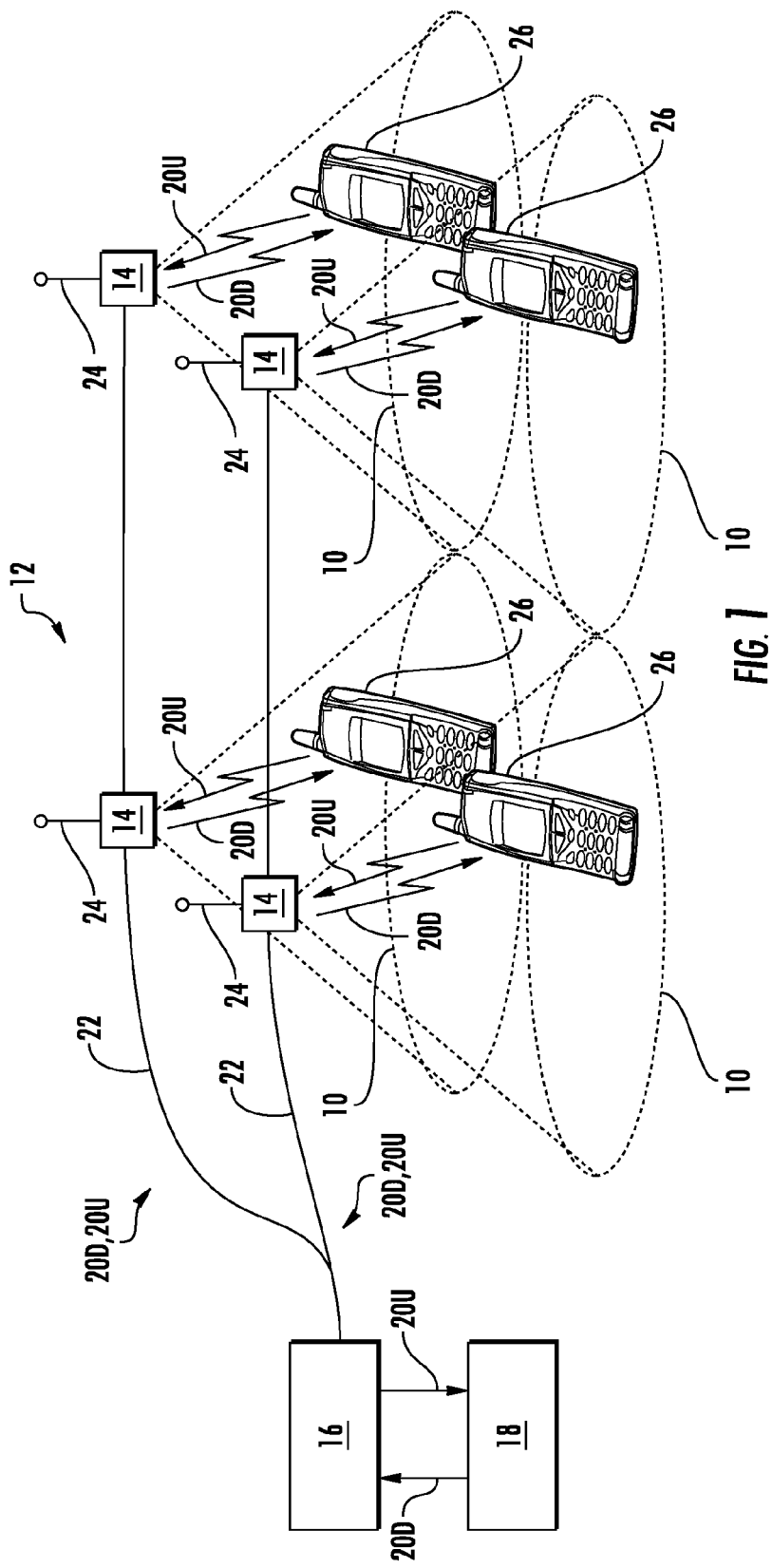
FIG. 1 is a schematic diagram of an exemplary distributed antenna system (DAS) capable of distributing wireless communications services to client devices.
Figure 2:
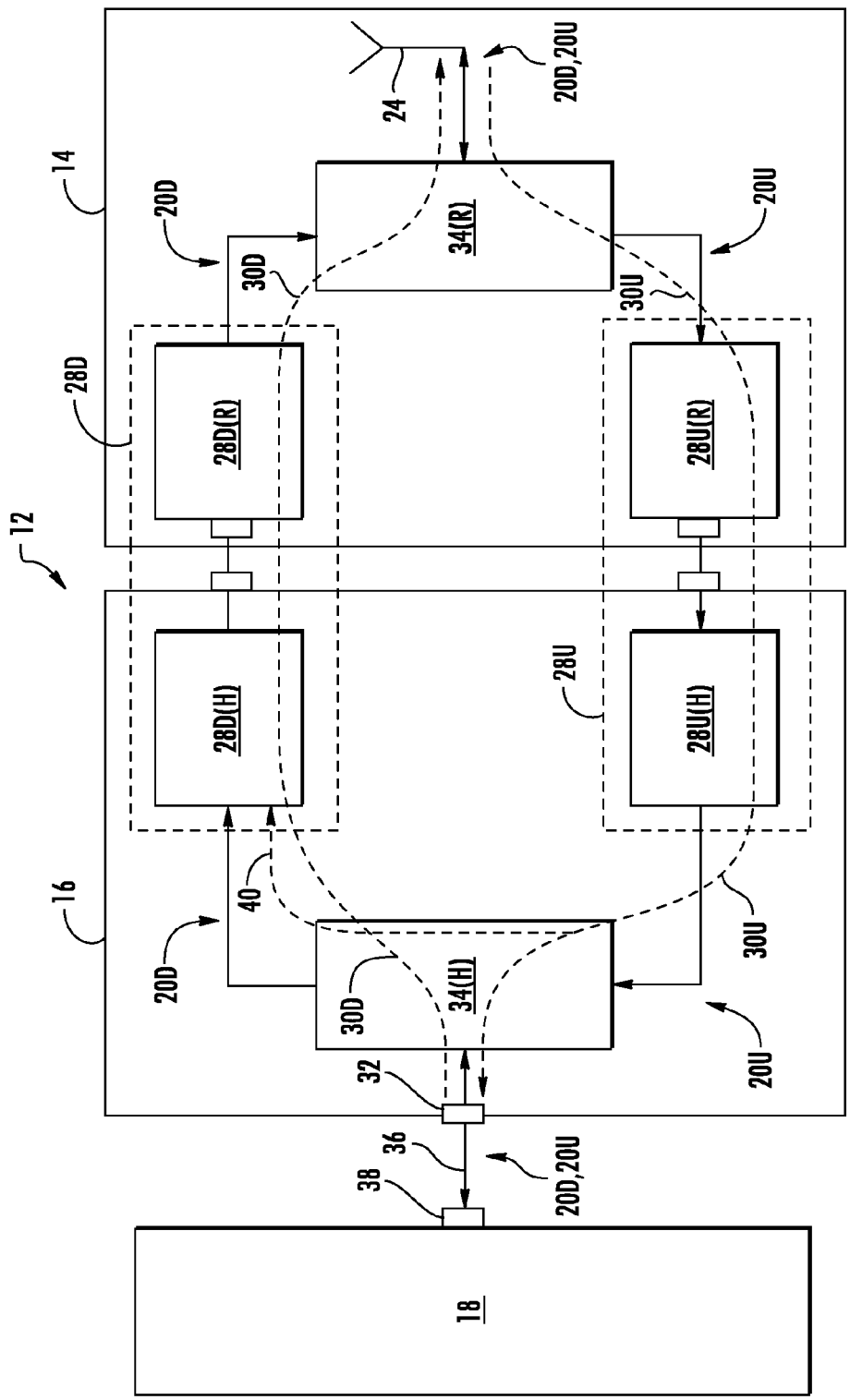
FIG. 2 is a schematic diagram illustrating exemplary downlink and uplink path circuits provided in respective downlink and uplink communications paths in the DAS of FIG. 1, wherein the downlink and uplink communications paths extend between a base station and a remote antenna, wherein the base station is coupled to the DAS via a duplexed port.
Figure 3:
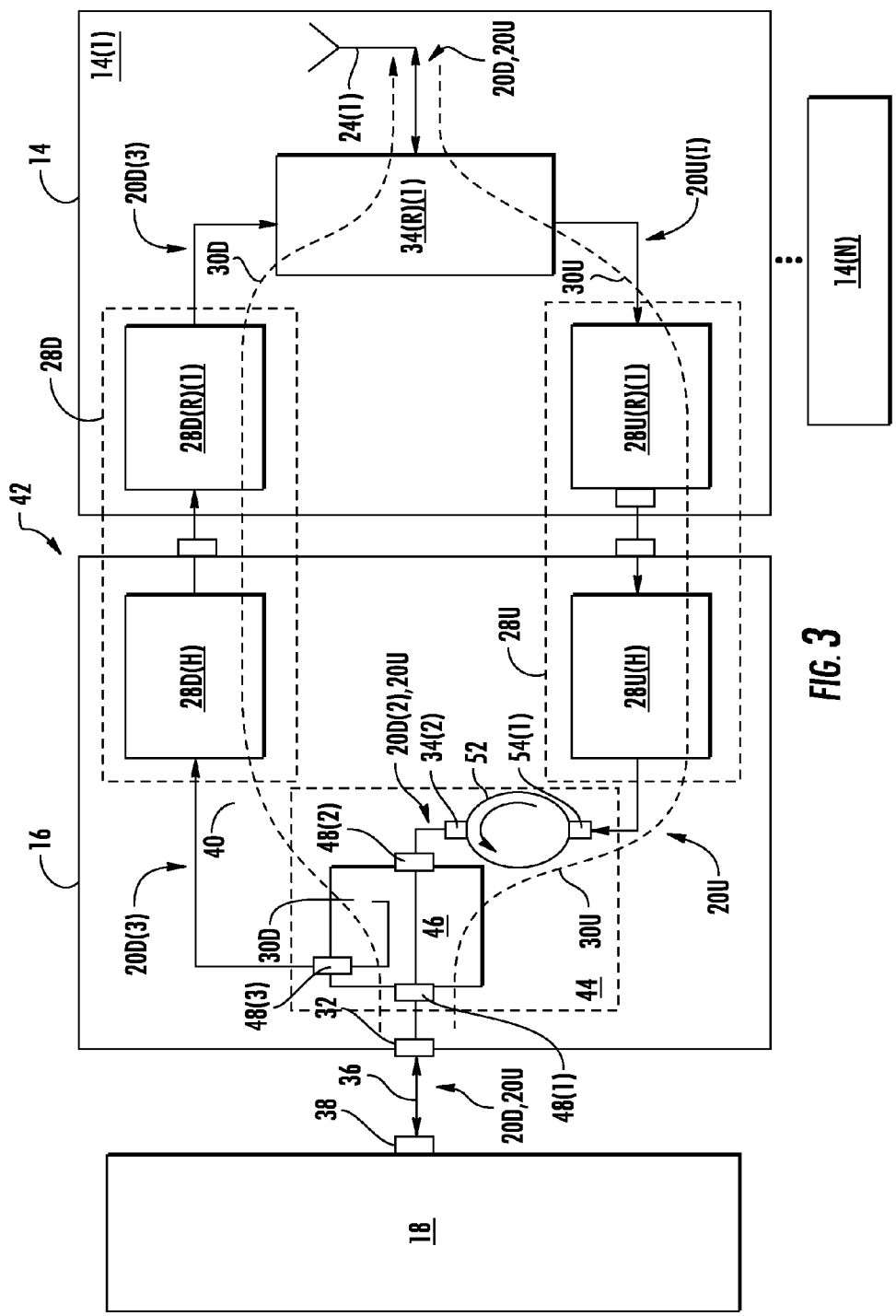
FIG. 3 is a schematic diagram of an exemplary DAS that includes an exemplary isolation circuit employing a directional coupler and at least one circulator to provide frequency independent isolation of a duplexed port configured to provide downlink communications signals to the DAS and receive uplink communications signals from the DAS.

FIG. 3 is a schematic diagram of an exemplary DAS 42 that includes an exemplary isolation circuit 44 to provide frequency independent isolation of the duplexed port 32 configured to provide the downlink communications signals 20D to the DAS 42 and receive uplink communications signals 20U from the DAS 42. The DAS 42 and isolation circuit 44 provided therein will be described in more detail below. The DAS 42 in FIG. 3 includes certain common components with the DAS 12 in FIG. 2, which are provided with common element numbers between FIGS. 2 and 3. The discussion of these common components in FIG. 2 is applicable to the DAS 42 in FIG. 3. Thus, these common components will not be re-described here.

The DAS 42 in FIG. 3 illustrates that a plurality of remote antenna units 14(1)-14(N) are provided that are each configured to receive downlink communications signals 20D from the duplexed port 32 and are each configured to provide uplink communications signals 20U to the duplexed port 32. In this regard, taking remote antenna unit 14(1) illustrated in FIG. 3 as an example, the remote antenna unit 14(1) includes remote downlink path circuits 28D(R)(1) to receive the downlink communications signals 20D, where '(1)' signifies the remote antenna unit 14(1). The remote antenna unit 14(1) also includes remote uplink path circuits 28U(R)(1) to receive uplink communications signals 20U(1) from the antenna 24(1). The internal components of the remote antenna units 14(2)-14(N) are not illustrated in FIG. 3, but it is noted that the same internal components illustrated as being provided in the remote antenna unit 14(1) in FIG. 3 can be provided in the other remote antenna units 14(2)-14(N) in FIG. 3, which would be signified with the same element number, but noted with a (2) . . . (N) suffix, for each respective remote antenna unit 14(2)-14(N).

With reference to FIG. 3, instead of providing a duplexer in the DAS 42 (e.g., duplexer 34(H) in FIG. 2) that isolates the downlink communications path 30D and uplink communications path 30U dependent on frequency separation or gap between the downlink and uplink communications signals 20D, 20U communicated over the downlink and uplink communications paths 30D, 30U, respectively, the isolation circuit 44 is provided. The isolation circuit 44 is coupled to the duplexed port 32 that provides the downlink communications signals 20D to the DAS 42 and receives the uplink communications signals 20U from the DAS 42. In order to isolate the uplink communications signals 20U from the downlink communications path 30D, the isolation circuit 44 includes a directional coupler 46. The directional coupler 46 provides frequency independent isolation between the uplink communications signals 20U and the downlink communications path 30D. In this manner, the isolation provided by the directional coupler 46 is not dependent on the frequency gap between the downlink and uplink communications signals 20D, 20U. This may be particularly important as the frequency gap between the downlink and uplink communications signals 20D, 20U becomes smaller as expansion of communications radio bands occurs for new technologies. For example, the frequency gap between the downlink and uplink communications signals 20D, 20U may be ten (10) MegaHertz (MHz) or less as a non-limiting example. The direction coupler 46 may be provided to provide isolation between the uplink communications signals 20U and the downlink communications path 30D by fifteen (15) decibels (dB) or more, as an example. As a non-limiting example, the directional coupler 46 may be the LTCC 20 dB directional coupler, model $CP890S20N sold by RN2 Technologies, Co., Ltd. of Korea.

Figure 4:
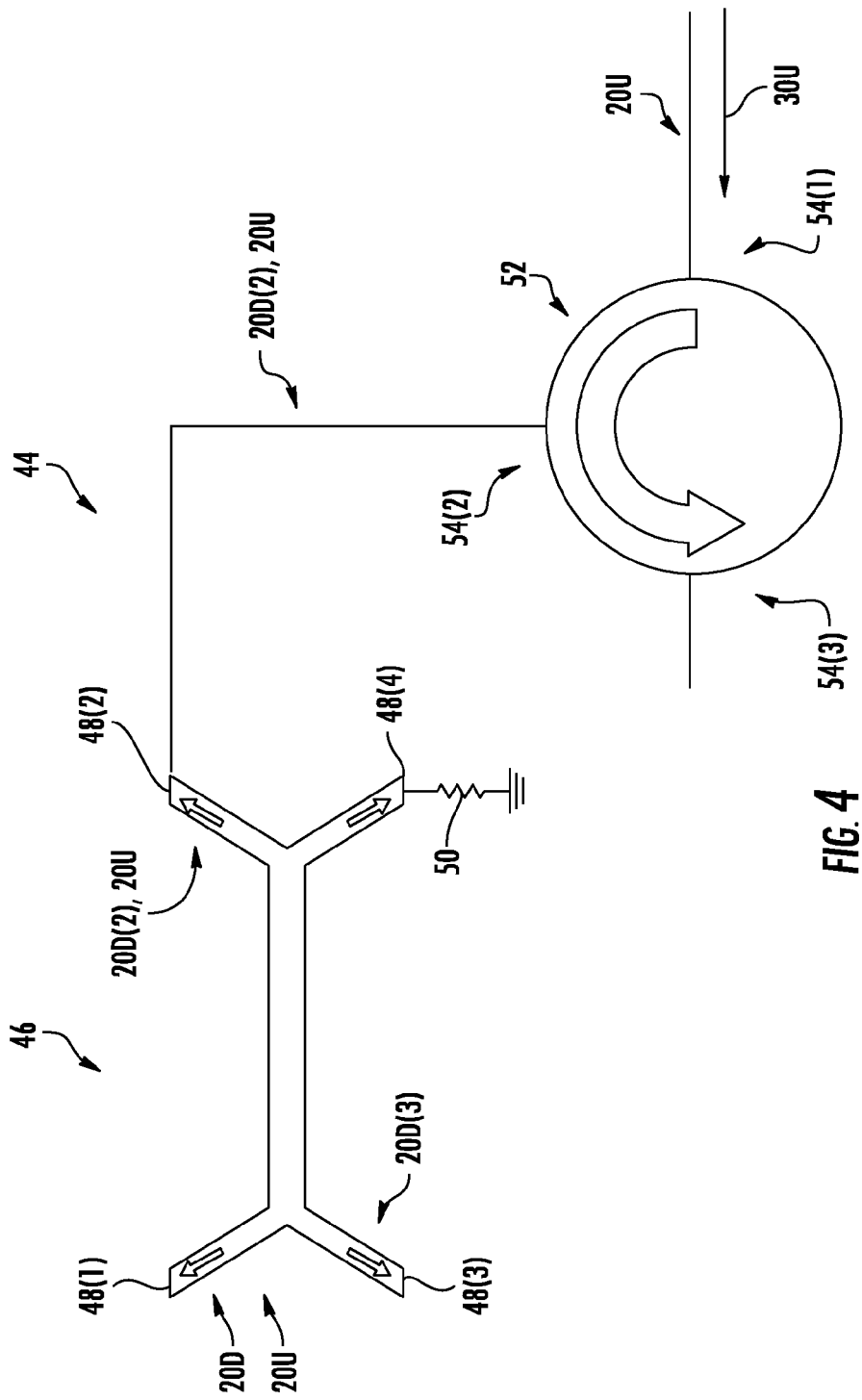
FIG. 4 is a schematic diagram of the isolation circuit in FIG. 3, illustrating more exemplary detail of the directional coupler and the circulator and their port connectivity.

In this regard, FIG. 4 illustrates more exemplary detail of the directional coupler 46 in FIG. 3 to facilitate a discussion of the isolation provided between the uplink communications signals 20U and the downlink communications path 30D by the directional coupler 46. As illustrated in FIGS. 3 and 4, the directional coupler 46 includes a first coupler port 48(1). The first coupler port 48(1) of the directional coupler 46 is configured as an input port configured to receive input power to be split between other ports. The first coupler port 48(1) is coupled to the duplexed port 32 in the DAS 42 in FIG. 3 to receive downlink communications signals 20D from the base station 18 as input signals. As will be described in more detail below, the directional coupler 46 is configured to split the downlink communications signals 20D into different output ports to be provided in the downlink communications path 30D of the DAS 42 to be distributed to the plurality of remote antenna units 14(1)-14(N).

With continuing reference to FIGS. 3 and 4, the directional coupler 46 also includes a second coupler port 48(2). The second coupler port 48(2) is configured as an output port in this example. The second coupler port 48(2) will receive a portion 20D(2) of the downlink communications signal 20D (hereinafter referred to as "downlink communications signal portion 20D(2)"). However, the second coupler port 48(2) is used as an input port to receive the uplink communications signals 20U from the plurality of remote antenna units 14(1)-14(N) to be provided to the duplexed port 32 and to the base station 18. In this regard, the second coupler port 48(2) is coupled to the uplink communications path 30U in the DAS 42 to receive uplink communications signals 20U from a plurality of remote antenna units 14(1)-14(N) in the uplink communications path 30U. The second coupler port 48(2) is coupled to the head-end uplink path circuit 28U(H) to receive the uplink communications signals 20U from the remote uplink path circuits 28U(R) in the plurality of remote antenna units 14(1)-14(N). The directional coupler 46 provides the uplink communications signal 20U received on the second coupler port 48(2) to the first coupler port 48(1) to be provided to the duplexed port 32 and the base station 18.

With continuing reference to FIGS. 3 and 4, the directional coupler 46 also includes a third coupler port 48(3). The third coupler port 48(3) is configured as a coupled, output port in this example. The third coupler port 48(3) is coupled to the downlink communications path 30D in the DAS 42 to direct the downlink communications signals 20D received on the first coupler port 48(1) from the duplexed port 32 to the downlink communications path 30D to be distributed to the plurality of remote antenna units 14(1)-14(N). More specifically, directional coupler 46 is configured to provide a portion 20D(3) of the downlink communications signals 20D (hereinafter the "downlink communications signal portion 20D(3)") received on the first coupler port 48(1) to the head-end downlink path circuit 28D(H) in the downlink communications path 30D. The head-end downlink path circuit 28D(H) is configured to distribute the downlink communications signal portion 20D(3) to the remote downlink path circuit 28D(R)(1)-28D(R)(N) of the remote antenna units 14(1)-14(N) to be communicated over their respective antennas 24(1)-24(N).

With reference to FIG. 4, the directional coupler 46 also includes a fourth coupler port 48(4), because the directional coupler 46 is a 4-port device in this example. In this example, the fourth coupler port 48(4) is an isolation port. A portion of the power of the uplink communications signal 20U applied to the second coupler port 48(2) will be coupled to the fourth coupler port 48(4). However, the directional coupler 46 is not used in this mode in this example. The fourth coupler port 48(4) is terminated with a matched load 50, which may be fifty (50) ohms as a non-limiting example.

The directional coupler 46 in FIGS. 3 and 4 is configured to provide for the power of the downlink communications signal portion 20D(3) to be greater than the power of the downlink communications signal portion 20D(2), so that majority of the power of the downlink communications signal 20D is provided in the downlink communications path 30D to be distributed to the remote antenna units 14(1)-14(N). The power of the downlink communications signal portion 20D(3) is controlled by the coupling factor ($C_{3,1}$) of the directional coupler 46, which is defined as:

$$C_{3,1} = -10\log\left(\frac{P_3}{P_1}\right) \text{ dB}$$

where:
$P_1$ is the input power on the first coupler port 48(1); and
$P_3$ is the output power on the third coupler port 48(3).

With continuing reference to FIGS. 3 and 4, the directional coupler 46 isolates the uplink communications signal 20U received on the second coupler port 48(2) from the third coupler port 48(3). In this manner, the uplink communications signal 20U received from the head-end uplink path circuits 28U(H) from the remote uplink path circuits 28U(R) of remote antenna units 14(1)-14(N) is isolated from the downlink communications signal portion 20D(3) provided on the third coupler port 48(3) on the downlink communications path 30D. As discussed above, the directional coupler 46 provides frequency independent isolation between the uplink communications signals 20U and the downlink communications path 30D. In this manner, the isolation provided by the directional coupler 46 is not dependent on the frequency gap between the downlink and uplink communications signals 20D, 20U. This may be particularly important as the frequency gap between the downlink and uplink communications signals 20D, 20U becomes smaller as expansion of communications radio bands occurs for new technologies. For example, the frequency gap between the downlink and uplink communications signals 20D, 20U may be ten (10) MegaHertz (MHz) or less as a non-limiting example. The directional coupler 46 can provide adequate isolation on the cross band (e.g., above 15 dB) even where the uplink communications signal 20U and the downlink communications signal 20D are close in frequency, using simple, low cost SMT components without the need for heavy, expensive duplexer.

The directional coupler 46 may be provided to provide isolation between the uplink communications signals 20U and the downlink communications path 30D by at least approximately fifteen (15) decibels (dB) or more, as an example. Providing isolation between the uplink communications signals 20U and the downlink communications path 30D may be particularly important for the DAS 42 in FIG. 3 to support communications services where the frequency gap between the downlink and uplink communications signals 20D, 20U is small (e.g., <=10 MHz). Otherwise, the uplink communications signals by leaking into the downlink communications path 30D could distort downlink communications signal portion 20D(3) and even add oscillations to the downlink communications signal portion 20D(3). The isolation level between the second coupler port 48(2) and the third coupler port 48(3) of the directional coupler 46 ($I_{3,2}$) can also be defined as the ratio of power between the output power of the downlink communications signal portion 20D (3) on the third coupler port 48(3) to the input power of the uplink communications signal 20U on the second coupler port 48(2), as follows:

$$I_{3,2} = -10\log\left(\frac{P_3}{P_2}\right) \text{ dB}$$

where:
  $P_3$ is the output power on the third coupler port 48(3); and
  $P_2$ is the input power on the second coupler port 48(2).

The isolation level between the second coupler port 48(2) and the third coupler port 48(3) of the directional coupler 46 can also be defined as the sum of the coupling ratio or factor (shown above as $C_{3,1}$) and the directivity of the directional coupler 46. Directivity of the directional coupler 46 is directly related to isolation provided to the directional coupler 46, which can be defined as follows:

$$D_{3,4} = -10\log\left(\frac{P_4}{P_3}\right) = -10\log\left(\frac{P_4}{P_1}\right) - 10\log\left(\frac{P_3}{P_1}\right) \text{ dB}$$

where:
  $P_3$ is the output power on the third coupler port 48(3); and
  $P_4$ is the output power on the fourth coupler port 48(4).

It may be desired to provide for the directivity of the directional coupler 46 to be as high as possible. Directivity is not directly measureable, and is calculated from the difference of the isolation and the coupling factor of the directional coupler 46, as follows:

$$D_{3,4} = I_{4,1} - C_{3,1} \text{ dB}$$

With continuing reference to FIGS. 3 and 4, while directional coupler 46 of the isolation circuit 44 provides isolation between the uplink communications signals 20U and the downlink communications path 30D, it is also desired to provide isolation between the downlink communications signals 20D and the uplink communications path 30U. However, as described above and illustrated in FIGS. 3 and 4, the second coupler port 48(2) of the directional coupler 46 receives the downlink communications signal portion 20D (2). If not isolated, this downlink communications signal portion 20D(2) would be provided in the uplink communications path 30U that would distort the uplink communications signals 20U in the head-end uplink path circuits 28U(H) combined from the uplink communications signals 20U(1)-20U(N) by the remote antenna units 14(1)-14(N). Thus, the isolation circuit 44 in the DAS 42 in FIG. 3 also includes a circulator 52 in this example. In this example, the circulator 52 acts as a one-direction isolation device, allowing uplink communications signals 20U to be directed from the second coupler port 48(2) to the directional coupler 46 with minimal or reduced attenuation while significantly attenuating the downlink communications signal portion 20D(2) directed from the directional coupler 46 to the second coupler port 48(2). It is also desired to isolate the uplink communications path 30D from the downlink communications signal 20D from the base station 18 in the DAS 42 in FIG. 3, because the power of the downlink communications signal 20D may overload the head-end and remote uplink path circuits 28U(H), 28U(R) in the uplink communications path 30U. For example, the power of the downlink communications signal 20D provided by the base station may be ten (10) Watts (W) as a non-limiting example.

With continuing reference to FIGS. 3 and 4, the circulator 52 in this example is a passive non-reciprocal three-port device in which a radio frequency signal entering any port is transmitted to the new port in rotation only. For example, with reference to FIG. 4, the circulator 52 includes a first circulator port 54(1). The first circulator port 54(1) is coupled to the uplink communications path 30U to receive the uplink communications signal 20U from the head-end uplink path circuits 28U(H). The circulator 52 also includes a second circulator port 54(2). The second circulator port 54(2) is coupled to the second coupler port 48(2) of the directional coupler 46. The circulator 52 is configured to provide the received uplink communications signal 20U on the first circulator port 54(1) to the second circulator port 54(2) to be provided to the second coupler port 48(2) of the directional coupler 46. In this manner, the directional coupler 46 can provide the received uplink communications signal 20U on the second coupler port 48(2) to the first coupler port 48(1) to be provided to the duplexed port 32. The circulator 52 is also configured to attenuate the downlink communications signal portion 20D(2) received in the second circulator port 54(2), because the circulator 52 is configured to transport the received downlink communications signal portion 20D(2) to a third circulator port 54(3), which is not coupled to the uplink communications path 30D. In this manner, the circulator 52 provides isolation between the downlink communications signals 20D and the uplink communications path 30U.

Figure 5:
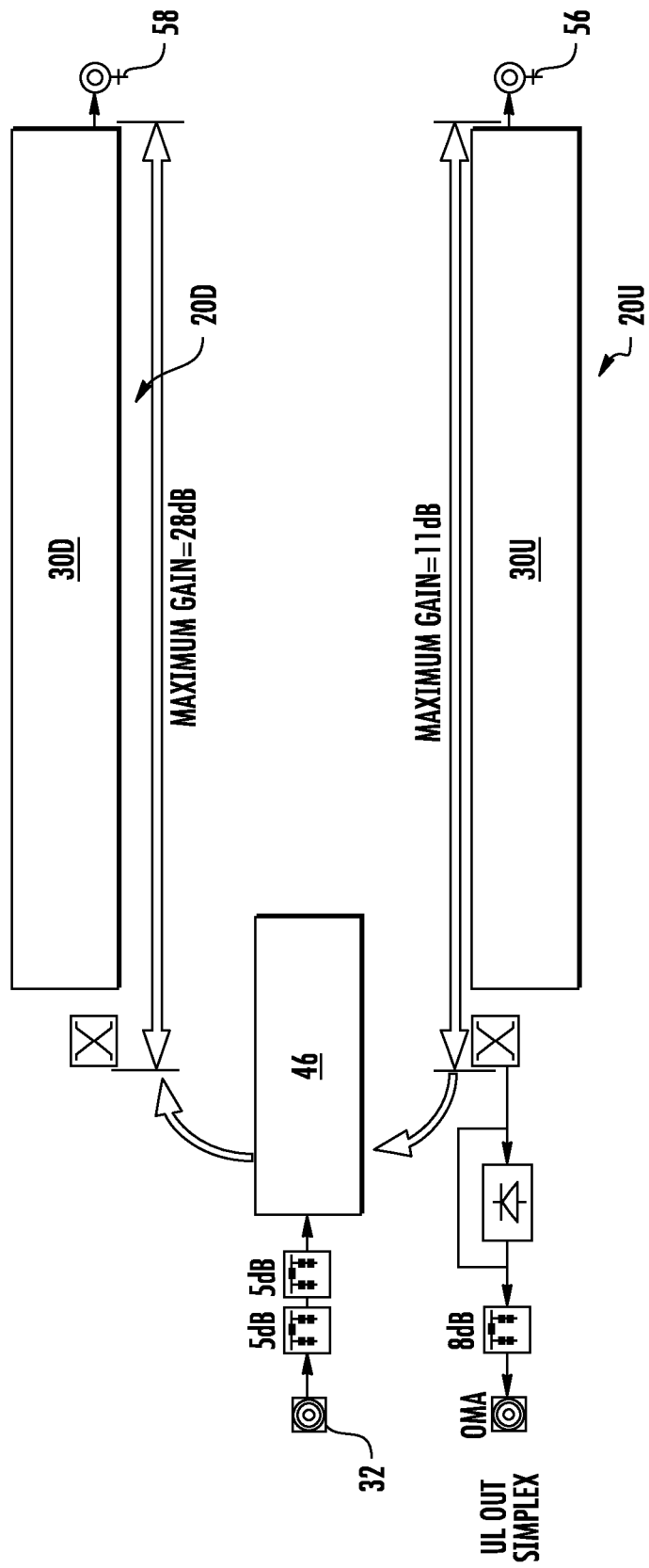
FIG. 5 is a schematic diagram illustrating exemplary loop gain and isolation calculations between downlink and uplink communications paths in the DAS in FIG. 3.

FIG. 5 is a schematic diagram illustrating exemplary loop gain and isolation calculations between downlink and uplink communications paths in the DAS 42 in FIG. 3. As illustrated therein, the maximum gain provided in the uplink communications path 30U from the directional coupler 46 to an uplink input 56 at a remote antenna unit 14 in this example is 11 dB. The maximum gain provided in the downlink communications path 30D in this example is 28 dB from the directional coupler 46 to a downlink output 58 at the remote antenna unit 14. As discussed above, the directional coupler 46 is operable to provide at least approximately 15 dB or more of isolation between the uplink communications signals 20U from the uplink communications path 30U and the downlink communications path 30D.

Thus, the total uplink input 56 to downlink output 58 isolation is this example is −1 dB, which is 11 dB maximum gain provided in the uplink communications path 30U+28 dB maximum gain provided in the downlink communications path 30D in this example is 28 dB-40 dB directional coupler 46 isolation. An additional 20 dB of isolation can be provided in this example by employing uplink and downlink band pass filters having out-of-band rejection in the cross over region of the uplink and downlink communications signals 20U, 20D, thus providing −21 dB isolation (i.e., −1 dB−21 dB).

Figure 6:
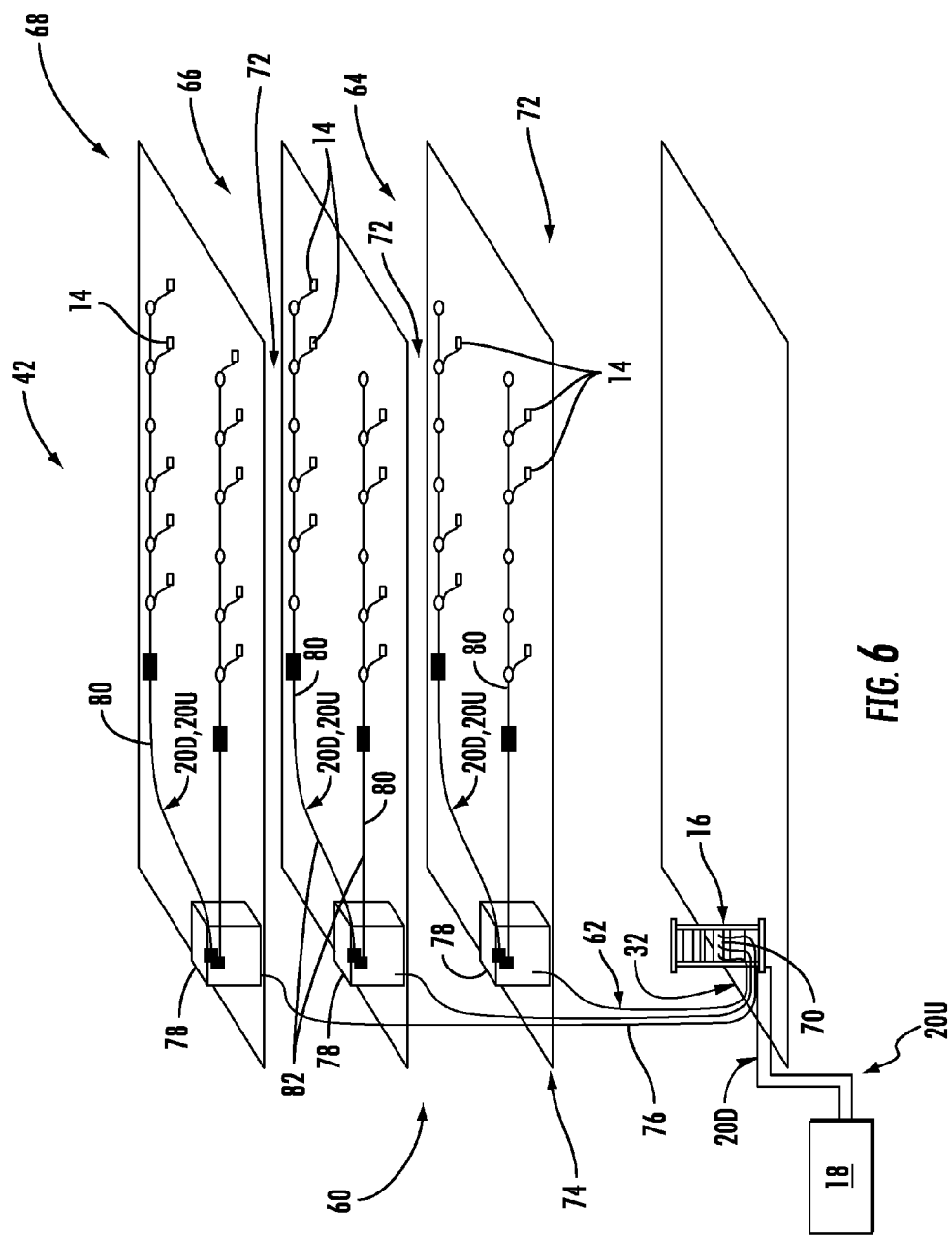
FIG. 6 is a partially schematic cut-away diagram of an exemplary building infrastructure in which the DASs employing frequency independent isolation of duplexed ports disclosed herein can be employed.

The DAS 42 employing the isolation circuit 44 in FIG. 3 can be provided in any environment desired. For example, the DAS 42 may be deployed indoors. To provide further exemplary illustration of how the DAS 42 can be deployed indoors, FIG. 6 is provided. FIG. 6 is a partially schematic cut-away diagram of a building infrastructure 60 employing the DAS 42. The building infrastructure 60 generally represents any type of building in which the DAS 42 can be deployed. As previously discussed with regard to FIG. 3, the DAS 42 incorporates the head-end unit 16 to provide various types of communications services to coverage areas within the building infrastructure 60, as an example.

The directional couplers provided in the isolation circuits disclosed herein may be provided as a 3-port or a 4-port coupler. The directivity of the directional couplers may be provided to any dB level desired, such as −23 dB as a non-limiting example. The directional couplers may be configured to direct radio-frequency signals in any frequency range desired, such as 700-1000 MHz, as a non-limiting example. The characteristic impedance of the directional couplers may be designed to be any impedance desired, such as fifty (50) Ohms as a non-limiting example. The directional couplers may be designed to operate over a desired temperature range, such as −55 to 125 degrees Celsius as a non-limiting example.

For example, as discussed in more detail below, the DAS 42 in this embodiment is configured to receive the downlink communications signals 20D and distribute the downlink communications signals 20D to remote antenna units 14. For example, if the DAS 42 is an optical fiber-based DAS as illustrated in FIG. 6, the downlink communications signals 20D are distributed over optical fiber 62 to multiple remote antenna units 14 in a point to multi-point configuration. The DAS 42 in this embodiment can be, for example, an indoor distributed antenna system (IDAS) to provide wireless service inside the building infrastructure 60. These wireless signals can include cellular service, wireless services such as RFID tracking, Wireless Fidelity (WiFi), local area network (LAN), WLAN, public safety, wireless building automations, and combinations thereof, as examples.

With continuing reference to FIG. 6, the building infrastructure 60 in this embodiment includes a first (ground) floor 64, a second floor 66, and a third floor 68. The floors 64, 66, 68 are serviced by the head-end unit 16 through a main distribution frame 70 to provide antenna coverage areas 72 in the building infrastructure 60. Only the ceilings of the floors 64, 66, 68 are shown in FIG. 6 for simplicity of illustration. In the example embodiment, a main cable 74 has a number of different sections that facilitate the placement of a large number of remote antenna units 14 in the building infrastructure 60. Each remote antenna unit 14 in turn services its own coverage area in the antenna coverage areas 72. The main cable 74 can include, for example, a riser cable 76 that carries all of the downlink and uplink optical fibers 62 to and from the head-end unit 16. The riser cable 76 may be routed through an interconnect unit (ICU) 78. The ICU 78 may be provided as part of or separate from the power supply (not shown). The ICU 78 may also be configured to provide power to the remote antenna units 14 via the electrical power line (not shown) provided inside an array cable 80, or tail cable or home-run tether cable as other examples, and distributed with the optical fibers 62 to the remote antenna units 14.

The main cable 74 enables multiple optical fiber cables 82 to be distributed throughout the building infrastructure 60 (e.g., fixed to the ceilings or other support surfaces of each floor 64, 66, 68) to provide the antenna coverage areas 72 for the first, second, and third floors 64, 66, and 68. In an example embodiment, the head-end unit 16 is located within the building infrastructure 60 (e.g., in a closet or control room), while in another example embodiment, the head-end unit 16 may be located outside of the building infrastructure 60 at a remote location. The base station 18, which may be provided by a second party such as a cellular service provider, is connected to the head-end unit 16 through the duplexer port 32, as previously discussed. The base station 18 is any station or signal source that provides the downlink communications signals 20D to the head-end unit 16 and can receive return uplink communications signals 20U from the head-end unit 16.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); a machine-readable transmission medium (electrical, optical, acoustical, or other form of propagated signals (e.g., carrier waves, infrared signals, digital signals, etc.)); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor or any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

The operational steps described in any of the exemplary embodiments herein may be performed in numerous different sequences other than the illustrated sequences. Furthermore, operations described in a single operational step may actually be performed in a number of different steps, and one or more operational steps may be combined. Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An isolation circuit for providing frequency independent isolation of a duplexed port in a wireless communications system (WCS), comprising:
    a directional coupler, comprising:
        a first coupler port configured to be coupled to a duplexed port of a WCS to receive a downlink communications signal, the duplexed port configured to provide duplexed downlink communications signals and uplink communications signals;
        a second coupler port configured to be coupled to an uplink communications path in the WCS to receive an uplink communications signal in the uplink communications path and receive a first portion of the downlink communications signal received by the first coupler port; and
        a third coupler port configured to be coupled to a downlink communications path in the WCS to direct a second portion of the downlink communications signal received on the first coupler port from the duplexed port to the downlink communications path;
        the directional coupler configured to isolate an uplink communications signal received on the second coupler port from the third coupler port, to isolate the uplink communications signal from the second portion of the downlink communications signal directed to the third coupler port; and
    at least one circulator, comprising:
        a first circulator port configured to be coupled to the uplink communications path in the WCS to receive the uplink communications signal from the uplink communications path; and
        a second circulator port coupled to the second coupler port of the directional coupler;
        the at least one circulator configured to:
            provide the uplink communications signal received on the first circulator port to be provided to the second circulator port to be provided to the second coupler port of the directional coupler; and
            attenuate the first portion of the downlink communications signal received in the second circulator port.

2. The isolation circuit of claim 1, wherein the directional coupler is further configured to isolate the uplink communications signals received on the second coupler port from the downlink communications path of the WCS.

3. The isolation circuit of claim 2, wherein the directional coupler is configured to provide at least approximately 15 decibels (dB) isolation between the uplink communications signal from the second portion of the downlink communications signal directed to the third coupler port.

4. The isolation circuit of claim 2, wherein the directional coupler is further comprised of a fourth coupler port connected to a matched load.

5. The isolation circuit of claim 2, wherein the at least one circulator is further configured to attenuate the downlink communications signal received in the second circulator port provided on the uplink communications path of the WCS.

6. The isolation circuit of claim 1, wherein the at least one circulator is comprised of a plurality of circulators connected in series.

7. A method of frequency independent isolating a duplexed port in a wireless communications system (WCS), comprising:
   receiving a downlink communications signal from a duplexed port of a WCS on a first coupler port of a directional coupler;
   directing a first portion of the received downlink communications signal on the first coupler port, to a second coupler port of the directional coupler;
   directing a second portion of the received downlink communications signal on the first coupler port, to a third coupler port of the directional coupler;
   isolating an uplink communications signal received on the second coupler port of the directional coupler from the third coupler port to isolate the uplink communications signal from the second portion of the downlink communications signal directed to the third coupler port;
   receiving the uplink communications signal from an uplink communications path in the WCS on a first circulator port in at least one circulator;
   directing the received uplink communications signal on the first circulator port to a second circulator port of the at least one circulator, the second circulator port coupled to the second coupler port; and
   attenuating the first portion of the received downlink communications signal on the second circulator port.

8. The method of claim 7, further comprising isolating the uplink communications signal received on the second coupler port from the downlink communications path of the WCS.

9. The method of claim 7, further comprising attenuating the downlink communications signal received in the second circulator port provided on the uplink communications path of the WCS.

10. The method of claim 8, further comprising providing, via the directional coupler, at least approximately 15 decibels (dB) isolation between the uplink communications signal from the second portion of the downlink communications signal directed to the third coupler port.

11. The method of claim 8, further comprising coupling a matched load to a fourth coupler port of the directional coupler.

12. A wireless communications system (WCS), comprising:
   a head-end unit, comprising:
      a plurality of head-end downlink path circuits each provided in a downlink communications path among a plurality of downlink communications paths, the plurality of head-end downlink path circuits each configured to receive a downlink communications signal in a downlink communications path from a duplexed port and provide the received downlink communications signal to at least one remote antenna unit among a plurality of remote antenna units;
      a plurality of head-end uplink path circuits each provided in an uplink communications path among a plurality of uplink communications paths, the plurality of head-end uplink path circuits each configured to receive an uplink communications signal from a remote antenna unit among the plurality of remote antenna units in an uplink communications path and provide the received uplink communications signal to the duplexed port;
   the plurality of remote antenna units, each comprising:
      at least one antenna;
      a remote downlink path circuit provided in at least one downlink communications path among the plurality of downlink communications paths, the remote downlink path circuit configured to receive downlink communications signals in the at least one downlink communications path from at, least one head-end downlink path circuit among the plurality of head-end downlink path circuits and wirelessly transmit the received downlink communications signals over the at least one antenna to at least one client device; and
      a remote uplink path circuit provided in an uplink communications path, the remote uplink path circuit configured to wirelessly receive uplink communications signals from the at least one antenna from at least one client device in the uplink communications path and provide the received uplink communications signals over the uplink communications path to a head-end uplink path circuit to be provided to the duplexed port; and
   an isolation circuit configured to:
      receive the downlink communications signal from the duplexed port on a first coupler port of a directional coupler;
      direct a first portion of the received downlink communications signal on the first coupler port, to a second coupler port of the directional coupler coupled to the plurality of uplink communications paths;
      direct a second portion of the received downlink communications signal on the first coupler port, to a third coupler port of the directional coupler coupled to the downlink communications path;
      isolate the uplink communications signal received on the second coupler port of the directional coupler from the third coupler port to isolate the uplink communications signal from the second portion of the downlink communications signal directed to the third coupler port;
      receive uplink communications signals from each of the plurality of remote antenna units on the plurality of uplink communications paths on a first circulator port in at least one circulator;
      direct the received uplink communications signals on the first circulator port to a second circulator port of the at least one circulator, the second circulator port coupled to the second coupler port; and
      attenuate the received first portion of the downlink communications signal on the second circulator port.

13. The WCS of claim 12, wherein the directional coupler is further configured to isolate the uplink communications signals received on the second coupler port from the downlink communications path of the WCS.

14. The WCS of claim 12, wherein the at least one circulator is further configured to attenuate the downlink communications signal received in the second circulator port provided on the uplink communications path of the WCS.

15. The WCS of claim 12, further comprising:
   at least one downlink optical fiber medium provided in the downlink communications path to carry the downlink communications signals from the head-end unit to the plurality of remote antenna units; and at least one uplink optical fiber medium provided in the uplink communications path to carry the uplink communications signals from the plurality of remote antenna units to the head-end unit.

16. The WCS of claim 15, wherein:
the at least one downlink optical fiber medium is comprised of a plurality of downlink optical fibers provided for each of the plurality of remote antenna units in the downlink communications path to carry the downlink communications signals from the head-end unit to the plurality of remote antenna units; and
the at least one uplink optical fiber medium is comprised of a plurality of uplink optical fibers provided for each of the plurality of remote antenna units in the uplink communications path to carry the uplink communications signals from the plurality of remote antenna units to the head-end unit.

17. The WCS of claim 12, wherein the isolation between a remote antenna unit among the plurality of remote antenna units and the first coupler port is approximately −1 dB.

18. The WCS of claim 12, wherein the isolation between a remote antenna unit among the plurality of remote antenna units and the first coupler port is approximately −21 dB.

19. The WCS of claim 13, wherein the directional coupler is configured to provide at least approximately 15 decibels (dB) isolation between the uplink communications signal from the second portion of the downlink communications signal directed to the third coupler port.

20. The WCS of claim 13, wherein the directional coupler is further comprised of a fourth coupler port connected to a matched load.

* * * * *

UNITED STATES PATENT AND TRADEMARK OFFICE
CERTIFICATE OF CORRECTION

PATENT NO. : 9,979,501 B2  
APPLICATION NO. : 15/131712  
DATED : May 22, 2018  
INVENTOR(S) : Yury Abramov et al.

Page 1 of 1

It is certified that error appears in the above-identified patent and that said Letters Patent is hereby corrected as shown below:

On the Title Page

On page 2, Column 1, item (56), other publications, Line 5, delete "Kyunggi-do," and insert -- Kyonggi-do --, therefor.

In the Claims

In Column 16, Line 12, Claim 12, delete "at, least" and insert -- at least --, therefor.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*